United States Patent
Uehling (10) Patent No.: US 8,895,409 B2
(45) Date of Patent: Nov. 25, 2014

(54) SEMICONDUCTOR WAFER PLATING BUS AND METHOD FOR FORMING

(71) Applicant: Trent S. Uehling, New Braunfels, TX (US)

(72) Inventor: Trent S. Uehling, New Braunfels, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 10 days.

(21) Appl. No.: 13/948,927

(22) Filed: Jul. 23, 2013

(65) Prior Publication Data

US 2013/0309860 A1 Nov. 21, 2013

Related U.S. Application Data

(62) Division of application No. 13/343,318, filed on Jan. 4, 2012, now Pat. No. 8,519,513.

(51) Int. Cl.
| | | |
|---|---|---|
| *H01L 21/301* | (2006.01) | |
| *H01L 21/445* | (2006.01) | |
| *H01L 23/58* | (2006.01) | |
| *H01L 21/768* | (2006.01) | |
| *H01L 23/00* | (2006.01) | |

(52) U.S. Cl.
CPC ........ *H01L 21/76838* (2013.01); *H01L 23/585* (2013.01); *H01L 24/05* (2013.01)
USPC .......................................... 438/465; 438/612

(58) Field of Classification Search
USPC ................................................ 438/465, 612
See application file for complete search history.

(56) References Cited

U.S. PATENT DOCUMENTS

| | | | |
|---|---|---|---|
| 5,648,661 | A | 7/1997 | Rostoker et al. |
| 5,654,588 | A | 8/1997 | Dasse et al. |
| 5,773,854 | A | 6/1998 | Pasch |
| 6,136,517 | A | 10/2000 | Fletcher |
| 6,479,887 | B1 | 11/2002 | Yoon et al. |
| 6,692,629 | B1 | 2/2004 | Chen et al. |
| 7,329,899 | B2 | 2/2008 | Farnworth et al. |
| 7,375,009 | B2 | 5/2008 | Chua et al. |
| 7,608,788 | B2 | 10/2009 | Johnson |
| 7,679,384 | B2 | 3/2010 | Chen et al. |
| 7,898,066 | B1 | 3/2011 | Scanlan et al. |
| 8,349,666 | B1 | 1/2013 | Leal et al. |
| 2004/0084777 | A1 | 5/2004 | Yamanoue et al. |
| 2006/0284174 | A1 | 12/2006 | Keller et al. |
| 2007/0132066 | A1 | 6/2007 | Takiar et al. |

(Continued)

OTHER PUBLICATIONS

U.S. Appl. No. 13/189,054, filed Jul. 22, 2011.

(Continued)

*Primary Examiner* — Zandra Smith
*Assistant Examiner* — Toniae Thomas
(74) *Attorney, Agent, or Firm* — Joanna G. Chiu; James L. Clingan, Jr.

(57) ABSTRACT

A semiconductor wafer includes a die, an edge seal, a bond pad, a plating bus, and trace. The die is adjacent to a saw street. The edge seal is along a perimeter of the die and includes a conductive layer formed in a last interconnect layer of the die. The bond pad is formed as part of metal deposition layer above the last interconnect layer or part of the last interconnect layer. The plating bus is within the saw street. The trace is connected to the bond pad and to the plating bus (1) over the edge seal, insulated from the edge seal, and formed in the metal deposition layer or (2) through the edge seal and insulated from the edge seal.

8 Claims, 8 Drawing Sheets

(56) References Cited

U.S. PATENT DOCUMENTS

| | | |
|---|---|---|
| 2009/0127666 A1 | 5/2009 | Watanabe et al. |
| 2009/0224242 A1 | 9/2009 | Cowles et al. |
| 2010/0187671 A1 | 7/2010 | Lin et al. |
| 2011/0298077 A1 | 12/2011 | Bolken et al. |
| 2012/0256303 A1 | 10/2012 | Meynen et al. |
| 2012/0273967 A1 | 11/2012 | Do et al. |
| 2013/0017642 A1 | 1/2013 | Mitgrew et al. |

OTHER PUBLICATIONS

U.S. Appl. No. 13/189,060, filed Jul. 22, 2011.

SEMICONDUCTOR WAFER PLATING BUS AND METHOD FOR FORMING

BACKGROUND

1. Field

This disclosure relates generally to semiconductor processing, and more specifically, to a semiconductor wafer plating bus.

2. Related Art

In semiconductor processing, plating may be used for forming wirebond pads, in which a metal layer is plated over the last metal layer to form the bond pad. Plating may be performed using either an electroless plating process or an electrolytic plating process. In order to plate features on a semiconductor wafer using an electrolytic plating process, a plating bus layer is first applied over the final passivation layer and subsequently removed after the features are plated. However, the processes of applying and removing the plating bus are added cost processes. Electroless plating is a less expensive process, as compared to electrolytic plating, in which, rather than forming a plating bus, metal surfaces exposed by the final passivation layer are activated for the plating. However, electroless plating is harder to control than electrolytic plating and therefore results in reduced yield.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one embodiment, an electrolytic plating process is used to form bond pads on a semiconductor wafer, in which the plating bus is formed during fabrication of the semiconductor wafer by using the last interconnect metal layer. The last interconnect metal layer is formed prior to deposition of the bond pad metal and prior to deposition of the final passivation layer. After formation of the over pad metallurgy (OPM) on the bond pad metal using electrolytic plating, the bus connections are severed and discarded during the die singulation process. In this manner, a plating bus is not formed over final passivation for plating the OPM on the bond pad metal, and the plating bus need not be removed after plating. Therefore, by using the last interconnect metal layer for formation of the plating bus, cost may be reduced.

Figure 1:
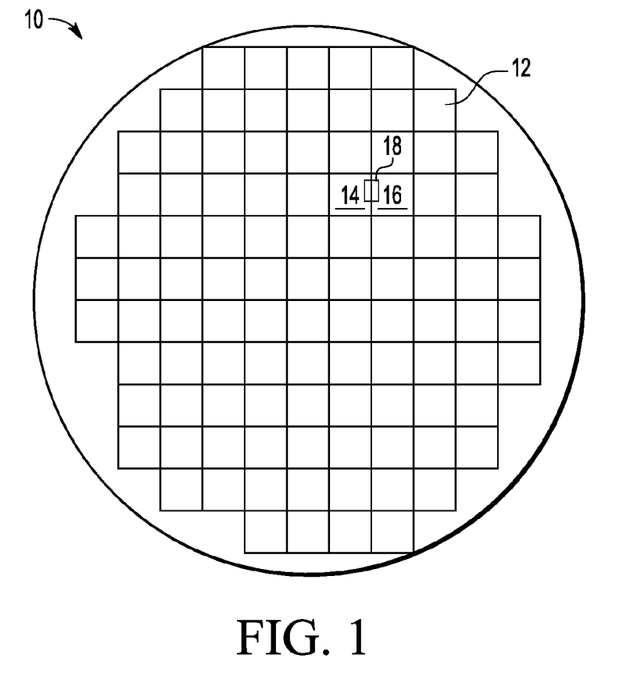
FIG. 1 illustrates a top down view of a semiconductor wafer in accordance with an embodiment of the present invention.

FIG. 1 illustrates a top down view of a semiconductor wafer 10 in accordance with an embodiment of the present invention. Semiconductor wafer 10 includes a plurality of semiconductor die 12 which are fabricated simultaneously during the fabrication of semiconductor wafer 10. The plurality of die 12 includes a semiconductor die 14 and a semiconductor die 16 which is adjacent to die 14. Section 18 indicates a section of semiconductor wafer 10 that will be discussed in more detail in reference to FIGS. 2-15 below.

Figure 2:
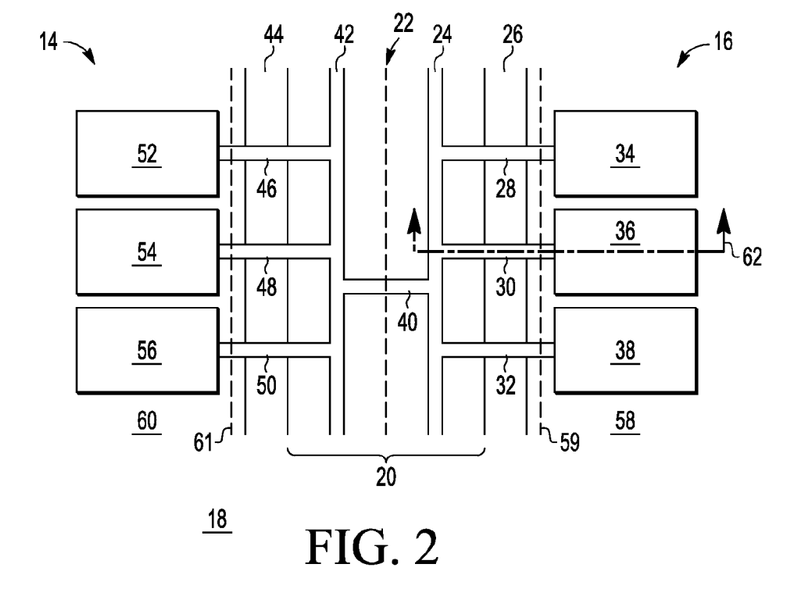
FIG. 2 illustrates a top down view of a section of the semiconductor wafer of FIG. 1 in accordance with an embodiment of the present invention.

FIG. 2 illustrates a top down view of section 18 of semiconductor wafer 10 in accordance with an embodiment of the present invention. Section 18 includes a portion of die 14 and a portion of die 16, with dotted line 22 representing the center line between the portions of die 14 and 16 (corresponding to the solid black line between die 14 and 16 within section 18 in FIG. 1). Therefore, when looking at the page, the portion of die 14 is to the left of line 22 and the portion of die 16 is to the right of line 22. Die 16 includes bond pads 34, 36, and 38, plating bus 24, traces 28, 30, and 32, and edge seal 26. Die 16 also includes circuitry 58 whose boundary is indicated by dotted line 59. Therefore, circuitry 58 of die 16 is located to the right of boundary 59. Edge seal 26 lies along the perimeter of die 16. Edge seal 26 is located between boundary 59 and plating bus 24. In one embodiment, edge seal 26 completely surrounds boundary 59 and circuitry 58 of die 16 and may function as a crack stop seal, a moisture seal, or both. Furthermore, edge seal 26 may include any number of concentric rings. Traces 28, 30, and 32 electrically connect each of bond pads 34, 36, and 38, respectively, to plating bus 24. In the illustrated embodiment, traces 28, 30, and 32 are located over edge seal 26 and include portions of the last metal interconnect layer of die 16, as will be described in more detail in reference to the cross sections of FIGS. 3-7. Traces 28, 30, and 32 are located beneath the final passivation layer of die 16. Die 14 includes bond pads 52, 54, and 56, plating bus 42, traces 46, 48, and 50, and edge seal 44. Die 14 also includes circuitry 60 whose boundary is indicated by dotted line 61. Therefore, circuitry 60 of die 14 is located to the left of boundary 61. Edge seal 44 lies along the perimeter of die 14. Edge seal 44 is located between boundary 61 and plating bus 42. In one embodiment, edge seal 44 completely surrounds boundary 61 and circuitry 60 of die 14 and may function as a crack stop seal, a moisture seal, or both. Furthermore, edge seal 44 may include any number of concentric rings. Traces 46, 48, and 50 electrically connect each of bond pads 52, 54, and 56, respectively, to plating bus 42. In the illustrated embodiment, traces 46, 48, and 50 are located over edge seal 44 and include portions of the last metal interconnect layer of die 14. Traces 46, 48, and 50 are located beneath the final passivation layer of die 14. Note that the discussions which will be provided below with respect to die 16 also apply analogously to die 14. Saw street region 20 is located between edge seal 44 of die 14 and edge seal 26 of die 16. Edge seals 26 and 44 are each adjacent saw street 20. Also, wafer 10 includes a bus connector 40 which electrically connects plating busses 42 and 24. In this manner, during the electrolytic plating process, all bond pads of wafer 10 are simultaneously plating by using the plating bus. During wafer singulation, wafer 10 will be cut within the saw streets (such as saw street 20), between edge seal 44 and plating bus 42 and between edge seal 26 and plating bus 24, thus severing traces 46, 48, and 50, traces 28, 30, and 32, and bus connector 40.

Figure 3:
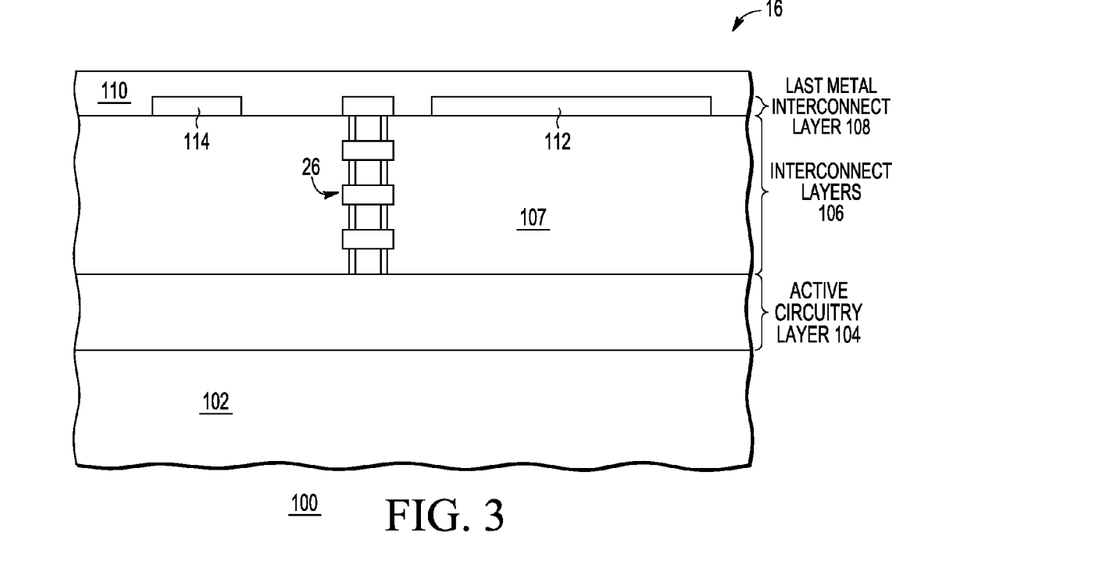
FIG. 3 illustrates a cross sectional view of a portion of the section of the semiconductor wafer of FIG. 2 at an initial stage in processing, in accordance with an embodiment of the present invention.

FIG. 3 illustrates a cross sectional view of a semiconductor structure 100 which represents a cross sectional view of the portion of die 16 illustrated in FIG. 2, taken through location 62 of FIG. 2, at an initial stage in processing. Semiconductor structure 100 includes a semiconductor substrate 102, active circuitry layer 104 formed over substrate 102, interconnect layers 106 formed over active circuitry layer 104, and last metal interconnect layer 108 formed over interconnect layers 106. Substrate 102 can be any semiconductor material or combinations of materials, such as gallium arsenide, silicon germanium, silicon-on-insulator (SOI), silicon, monocrystalline silicon, the like, and combinations of the above. Active circuitry 104 layer represents the layer in which the active circuitry of structure 100 is formed, and can include any type of circuitry which performs any type of functions, and the active circuitry may be formed on and within substrate 102. Referring to FIG. 2, the active circuitry of active circuitry layer 104 is formed to the right of boundary 59. Interconnect layers 106 may include any number of interconnect layers, in which each interconnect layer may include an intraconnect layer (also referred to as a metal layer) which may include metal portions (e.g. a patterned metal layer) which route signals within the intraconnect layer, and a via layer, which provides electrical connections between intraconnect layers. In one embodiment, the metal portions and vias of interconnect layers 106 may be copper. Interconnect layers 106 also includes edge seal 26 which is formed within the various metal layers and via layers of interconnect layers 106. Edge seal 26 forms a continuous metal layer which vertically extends through interconnect layers 106. Interconnect layers 106 also includes insulating material 107 which surrounds the metal portions and vias of interconnect layers 106. Last metal interconnect layer 108 (which may also be referred to as the last interconnect layer) includes a patterned metal layer which includes metal portions 114 and 112 which may route signals within the patterned metal layer of last metal interconnect layer 108. Last metal interconnect layer 108 also includes a top portion of edge seal 26 which is connected to the immediately underlying via portions of edge seal 26 within interconnect layers 106. Metal portions 114 and 112 and the top metal portion of edge seal 26 within last metal interconnect layer 108 may also be referred to as the last metal layer and may be formed of copper. Last metal interconnect layer 108 also includes a first passivation layer 110 over the last metal layer (over metal portions 114 and 112 and over edge seal 26).

Figure 4:
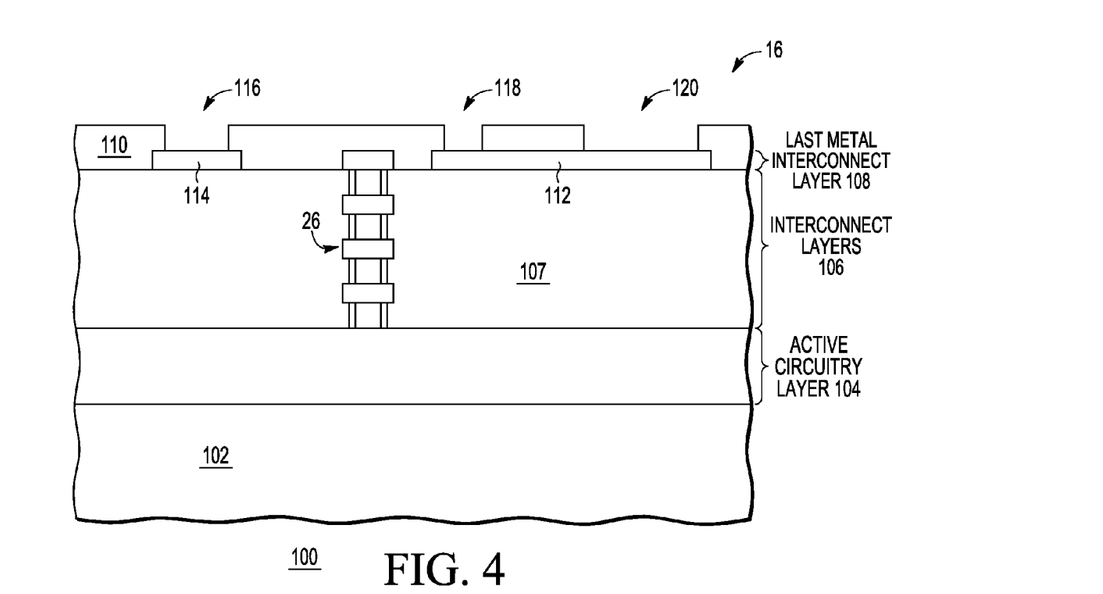
FIG. 4 illustrates a cross sectional view of the portion of FIG. 3 at a subsequent stage in processing, in accordance with an embodiment of the present invention.

FIG. 4 illustrates a cross sectional view of the portion of die 16 of FIG. 3 at a subsequent stage in processing. First passivation layer 110 is patterned to form openings 116, 118, and 120. Opening 116 exposes metal portion 114, and openings 118 and 120 expose different areas of metal portion 112.

Figure 5:
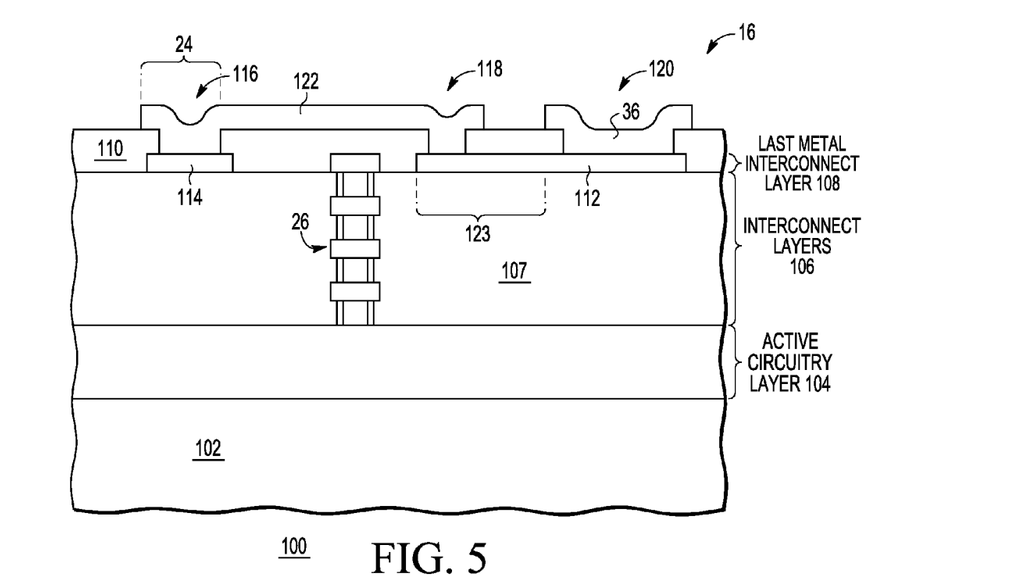
FIG. 5 illustrates a cross sectional view of the portion of FIG. 4 at a subsequent stage in processing, in accordance with an embodiment of the present invention.

FIG. 5 illustrates a cross sectional view of the portion of die 16 of FIG. 4 at a subsequent stage in processing. A patterned metal layer is formed over first passivation layer 110 and within openings 116, 118, and 120. A first portion 122 of the patterned metal layer is formed within opening 116 and within opening 118 and extending over edge seal 26. In this manner, portion 122 electrically contacts metal portions 114 and 112. Portion 122 is formed over first passivation layer 110 and edge seal 26 such that passivation layer 110 is located between portion 122 and edge seal 26 so as to electrically isolate edge seal 26 from metal portion 122. A second portion of the patterned metal layer is formed within opening 120 and corresponds to bond pad 36 of FIG. 2. Note that the patterned metal layer may also be referred to as the bond pad metal layer, and that bond pad 36 may also be referred to as bond pad metal 36. Also, as indicated in FIG. 5, plating bus 24 includes a section of portion 122; and the remaining section of portion 122, as well as portion 123 of metal portion 112, correspond to trace 30 of FIG. 2. Trace 30 is isolated from edge seal 26.

Figure 6:
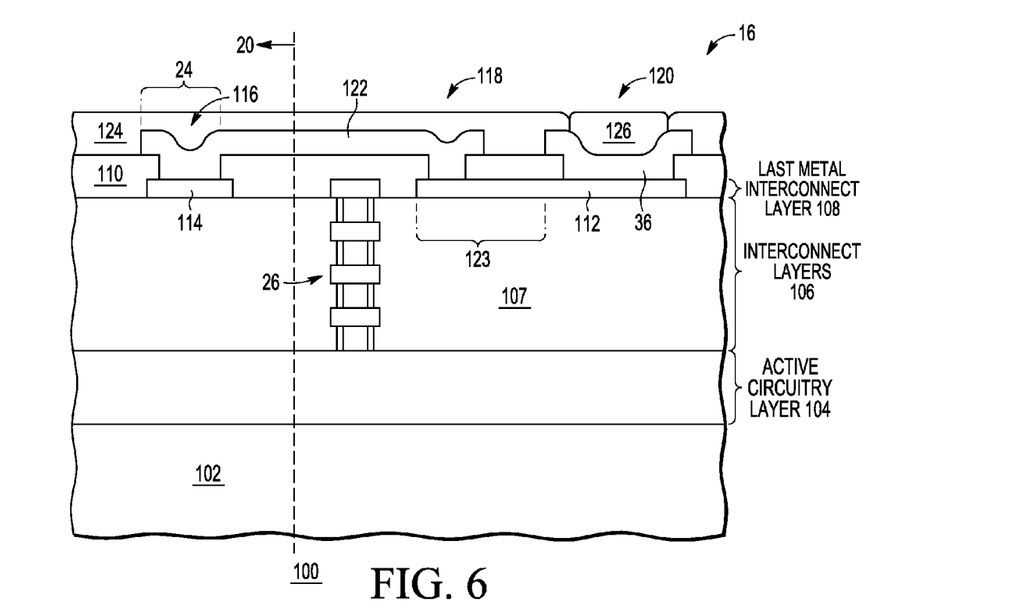
FIG. 6 illustrates a cross sectional view of the portion of FIG. 5 at a subsequent stage in processing, in accordance with an embodiment of the present invention.

FIG. 6 illustrates a cross sectional view of the portion of die 16 of FIG. 5 at a subsequent stage in processing. A final passivation layer 124 is formed over first passivation layer 110, and over the bond pad metal layer. Therefore, final passivation layer 110 is formed over metal portion 122 and bond pad 36. An opening is formed in final passivation layer 124 to expose bond pad 36 and an over pad metallurgy (OPM) 126 is then formed over the exposed portion of bond pad 36. In one embodiment, during plating, a voltage is applied to plating bus 24 such that a current is applied to bond pad 36 by way of metal portion 112, metal portion 122, and plating bus 24 (in which metal portions 122 and 112 correspond to trace 30). In this manner, OPM 126 can be electrolytically plated on bond pad 36. In one embodiment, OPM 126 is plated onto bond pad 36 by immersing wafer 10 into a plating solution and applying a voltage to plating bus 24. OPM 126 may be referred to as a plated layer and may include any number of plated layers. In one embodiment, OPM 126 includes a plated nickel layer. Therefore, as can be seen in FIG. 6, trace 30 and plating bus 24 are both located under final passivation layer 124. Trace 30 includes a portion (corresponding to a section of metal portion 122) which extends over edge seal 26 but is still located below final passivation layer 110. Note that saw street 20 is indicated in FIG. 6 as being to the left of the dotted line, in which edge seal 26 is located within die 16 and plating bus 24 is located within saw street 20.

Figure 7:
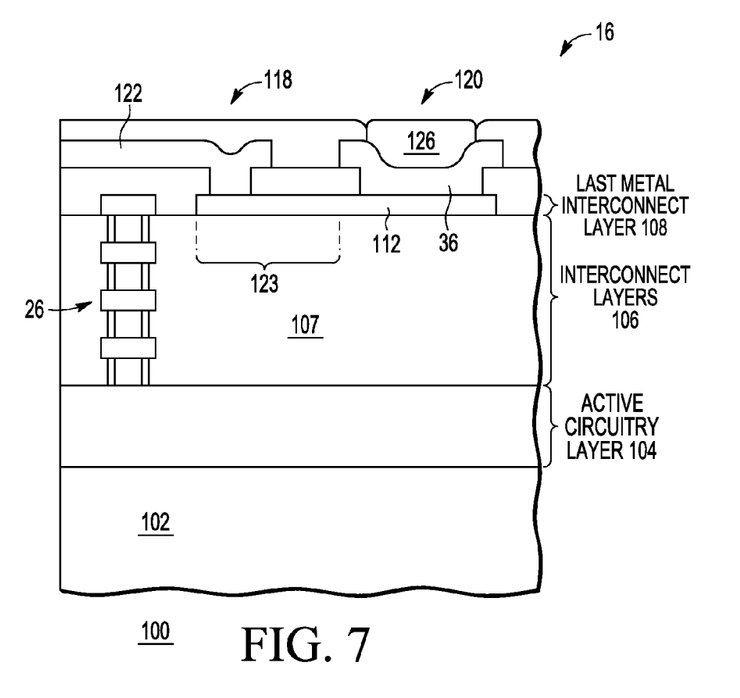
FIG. 7 illustrates a cross sectional view of the portion of FIG. 6 at a subsequent stage in processing, in accordance with an embodiment of the present invention.

FIG. 7 illustrates a cross sectional view of the portion of die 16 of FIG. 6 at a subsequent stage in processing. Wafer 10 is singulated which separates die 16 from wafer 10. The singulation occurs in saw street 20 and severs the plating bus connection. That is, plating bus 24 and part of trace 30 is severed from die 16. In this manner, referring back to FIG. 2, each of bond pads 34, 36, and 38 are no longer electrically connected to plating bus 24, and plating bus 24 is no longer connected to plating bus 42 since bus connector 40 is also severed.

Therefore, in the embodiment illustrated in FIGS. 2-7, a plating bus need not be added over final passivation 110 in order to electrolytically plate the OPM on bond pad metal 36. Furthermore, since a plating bus need not be added over final passivation 110, it also does not need to be subsequently removed.

Figure 8:
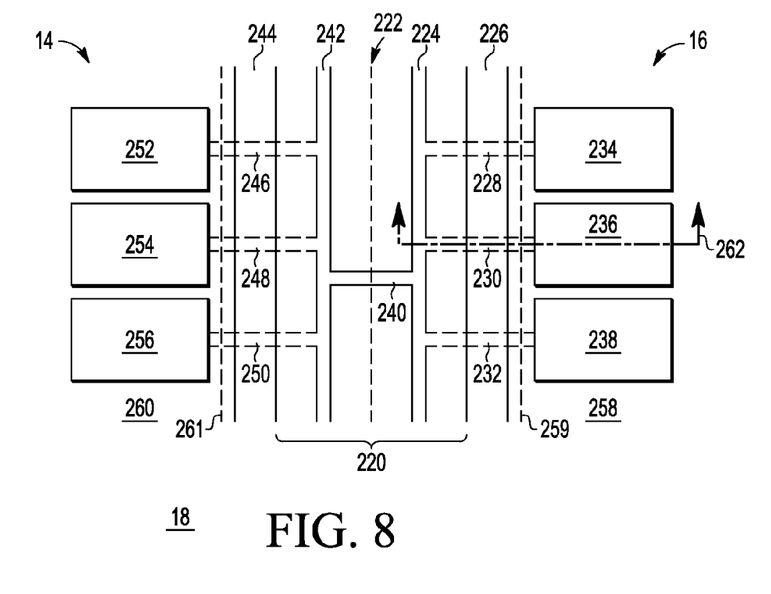
FIG. 8 illustrates a top down view of a section of the semiconductor wafer of FIG. 1 in accordance with an embodiment of the present invention.

FIG. 8 illustrates a top down view of section 18 of semiconductor wafer 10 in accordance with another embodiment of the present invention. Section 18 includes a portion of die 14 and a portion of die 16, with dotted line 222 representing the center line between the portions of die 14 and 16 (corresponding to the solid black line between die 14 and 16 within section 18 in FIG. 1). Therefore, when looking at the page, the portion of die 14 is to the left of line 222 and the portion of die 16 is to the right of line 222. Die 16 includes bond pads 234, 236, and 238, plating bus 224, traces 228, 230, and 232, and edge seal 226. Die 16 also includes circuitry 258 whose boundary is indicated by dotted line 259. Therefore, circuitry 258 of die 16 is located to the right of boundary 259. Edge seal 226 lies along a perimeter of die 16. Edge seal 226 is located between boundary 259 and plating bus 224. In one embodiment, edge seal 226 completely surrounds boundary 259 and circuitry 258 of die 16 and may function as a crack stop seal, a moisture seal, or both. Furthermore, edge seal 226 may include any number of concentric rings. Traces 228, 230, and 232 electrically connect each of bond pads 234, 236, and 238, respectively, to plating bus 224. In the illustrated embodiment, traces 228, 230, and 232 are located over edge seal 226 and include portions of the last metal interconnect layer of die 16, as will be described in more detail in reference to the cross sections of FIGS. 9-15. Traces 228, 230, and 232 are located beneath the final passivation layer of die 16. Die 14 includes bond pads 252, 254, and 256, plating bus 242, traces 246, 248, and 250, and edge seal 244. Die 14 also includes circuitry 260 whose boundary is indicated by dotted line 261. Therefore, circuitry 260 of die 14 is located to the left of boundary 261. Edge seal 244 lies along a perimeter of die 14. Edge seal 244 is located between boundary 261 and plating bus 242. In one embodiment, edge seal 244 completely surrounds boundary 261 and circuitry 260 of die 14 and may function as a crack stop seal, a moisture seal, or both. Furthermore, edge seal 244 may include any number of concentric rings. Traces 246, 248, and 250 electrically connect each of bond pads 252, 254, and 256, respectively, to plating bus 242. In the illustrated embodiment, traces 246, 248, and 250 are located over edge seal 244 and include portions of the last metal interconnect layer of die 14. Traces 246, 248, and 250 are located beneath the final passivation layer of die 14. Note that the discussions which will be provided below with respect to die 16 also apply analogously to die 14. Saw street region 220 is located between edge seal 244 of die 14 and edge seal 226 of die 16. Edge seals 226 and 244 are each adjacent saw street 220. Also, wafer 10 includes a bus connector 240 which electrically connects plating busses 242 and 224. In this manner, during the electrolytic plating process, all bond pads of wafer 10 are simultaneously plating by using the plating bus. During wafer singulation, wafer 10 will be cut within the saw streets (such as saw street 220), between edge seal 244 and plating bus 242 and between edge seal 226 and plating bus 224, thus severing traces 246, 248, and 250, traces 228, 230, and 232, and bus connector 240.

In the current embodiment, traces 228, 230, 232, 246, 248, and 250 are located under the final passivation layer and are formed through edge seal 226 or 244 rather than over the edge seals. In one embodiment, some traces may be formed over the edge seal while others may be formed through the edge seal in order to contact the plating busses.

Figure 9:
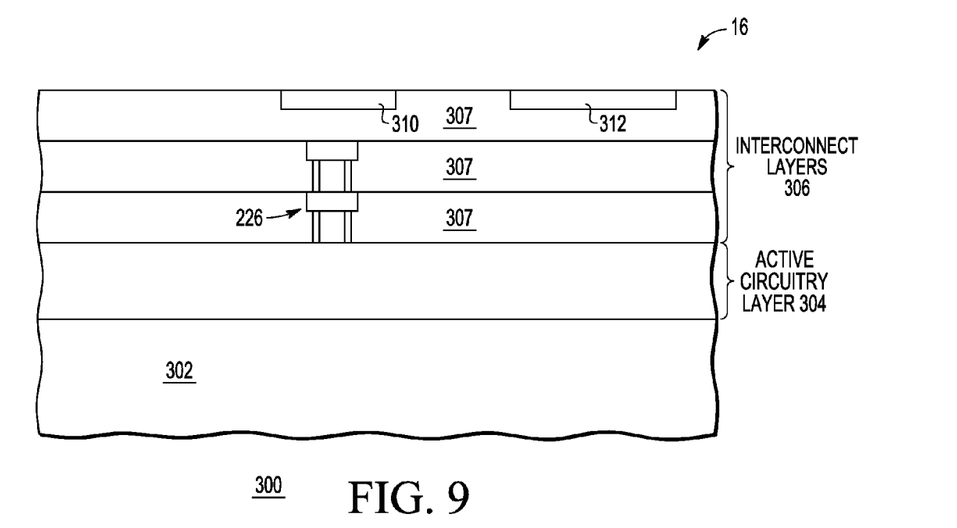
FIG. 9 illustrates a cross sectional view of a portion of the section of the semiconductor wafer of FIG. 8 at an initial stage in processing, in accordance with an embodiment of the present invention.

FIG. 9 illustrates a cross sectional view of a semiconductor structure 300 which represents a cross sectional view of the portion of die 16 illustrated in FIG. 8, taken through location 262 of FIG. 8, at an initial stage in processing. Semiconductor structure 300 includes a semiconductor substrate 302, active circuitry layer 304 formed over substrate 302, and interconnect layers 306 formed over active circuitry layer 104. Substrate 302 can be any semiconductor material or combinations of materials, such as gallium arsenide, silicon germanium, silicon-on-insulator (SOI), silicon, monocrystalline silicon, the like, and combinations of the above. Active circuitry 304 layer represents the layer in which the active circuitry of structure 300 is formed, and can include any type of circuitry which performs any type of functions, and the active circuitry may be formed on and within substrate 302. Referring to FIG. 8, the active circuitry of active circuitry layer 304 is formed to the right of boundary 259. Interconnect layers 306 may include any number of interconnect layers, in which each interconnect layer may include an intraconnect layer (also referred to as a metal layer) which may include metal portions (e.g. a patterned metal layer) which route signals within the intraconnect layer, and a via layer, which provides electrical connections between intraconnect layers. In the cross section of FIG. 9, formation of interconnect layers 306 is not complete such that at least one additional layer will be formed. Interconnect layers 306 also includes edge seal 226 which is formed within the various metal layers and via layers of interconnect layers 306. In the cross section of FIG. 9, formation of edge seal 226 is not complete such that additional interconnect layers will be formed which will continue formation of edge seal 226. Interconnect layers 306 also includes insulating material 307 which surrounds the metal portions and vias of interconnect layers 306. In FIG. 9, interconnect layers 306 also includes metal portions 310 and 312 at a top surface of interconnect layers 306. These routing portions 310 and 312 may be referred to as tracing routing portions which will allow for the formation of trace 228 which electrically connects bond pad 236 to plating bus 224.

Figure 10:
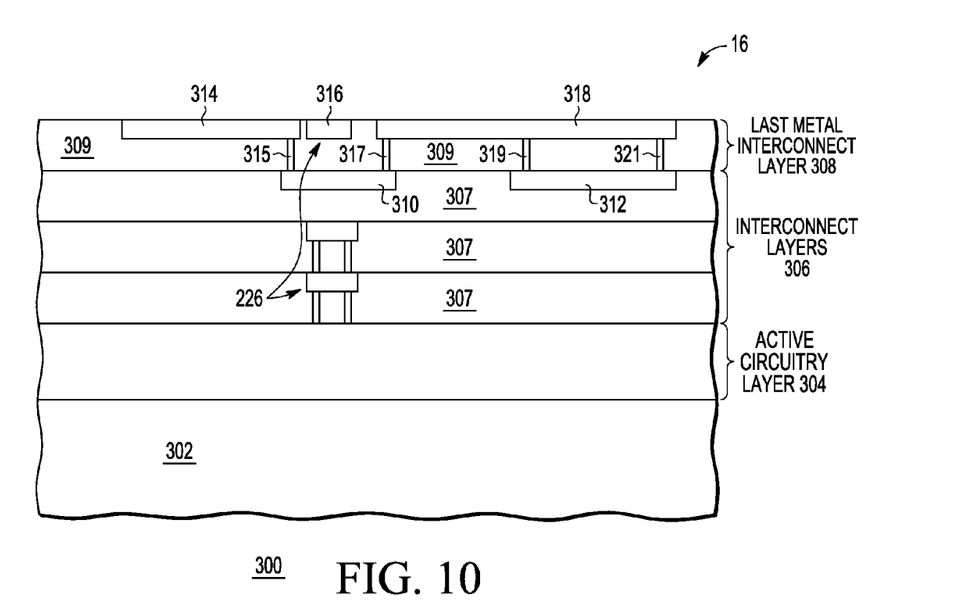
FIG. 10 illustrates a cross sectional view of the portion of FIG. 9 at a subsequent stage in processing, in accordance with an embodiment of the present invention.

FIG. 10 illustrates a cross sectional view of the portion of die 16 of FIG. 9 at a subsequent stage in processing. A last metal interconnect layer 308 is formed over interconnect layers 306. Last metal interconnect layer 308 (which may also be referred to as the last interconnect layer) includes a patterned metal layer which includes metal portions 314, 316, and 318. Metal portions 314 and 318 may route signals within the patterned metal layer of last metal interconnect layer 308. Metal portion 316 is a top portion of edge seal 226. Note that metal portions 314, 316, and 318 may be referred to as the last metal layer. Also, at least one via 315 connects metal portion 314 to metal portion 310 of interconnect layers 306 and at least one via 317 connects metal portion 318 to metal portion 310 of interconnect layers 306. At least one via 319, 321 connects metal portion 318 to metal portion 312 of interconnect layers 306. Last metal interconnect layer 308 also includes an insulating material 309 in which the metal portions and vias are formed. Note that, in the illustrated embodiment, edge seal 226 may still form a continuous metal layer which vertically extends through interconnect layers 306; however, as will be better seen in reference to FIG. 15 below, edge seal 226 includes openings through which traces may be formed. For example, metal portion 318, at least one via 317, metal portion 310, at least one via 315, and metal portion 314 form trace 230 which extends through edge seal 226 rather than over edge seal 226, and is still isolated from edge seal 226. In one embodiment, the metal portions and vias of interconnect layers 306 and last metal interconnect layer 308 include copper.

Figure 11:
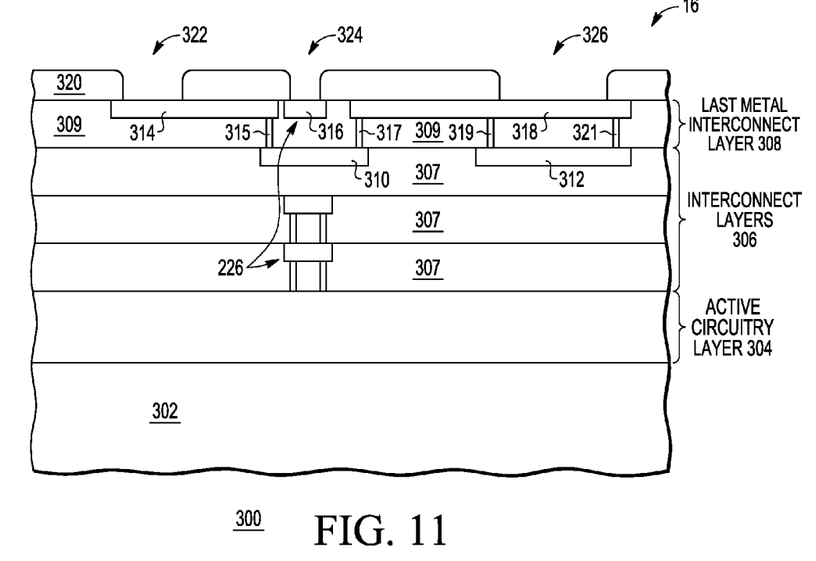
FIG. 11 illustrates a cross sectional view of the portion of FIG. 10 at a subsequent stage in processing, in accordance with an embodiment of the present invention.

FIG. 11 illustrates a cross sectional view of the portion of die 16 of FIG. 10 at a subsequent stage in processing. A first passivation layer 320 is formed over last metal layer 308. Therefore, first passivation layer 320 is formed over metal portions 314, 316, and 318. First passivation layer 320 is patterned to form openings 322, 324, and 326. Opening 322 in first passivation layer 320 exposes metal portion 314, opening 324 in first passivation layer 320 exposes metal portion 316 (which is a part of edge seal 226, thus exposing edge seal 226), and opening 326 in first passivation layer 320 exposes metal portion 318. In an alternate embodiment, opening 324 is not formed.

Figure 12:
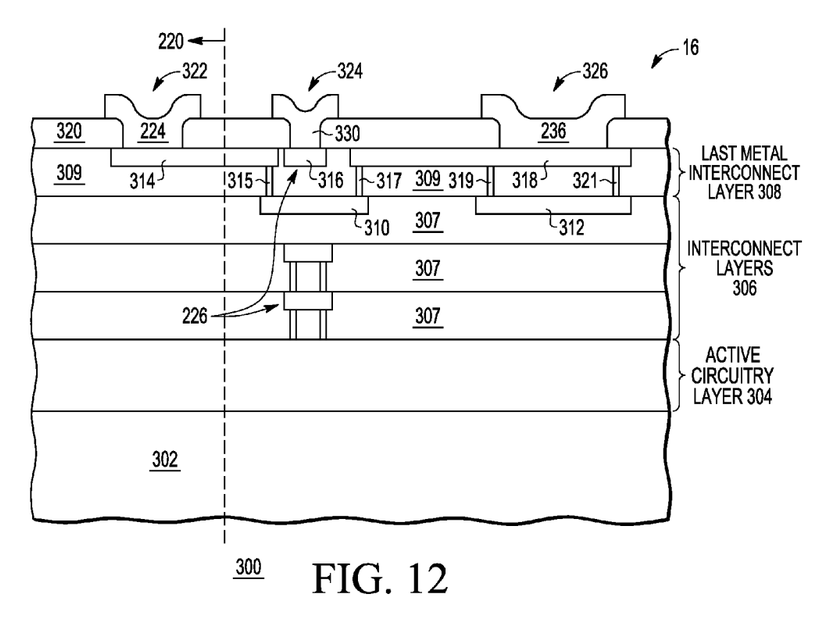
FIG. 12 illustrates a cross sectional view of the portion of FIG. 11 at a subsequent stage in processing, in accordance with an embodiment of the present invention.

FIG. 12 illustrates a cross sectional view of the portion of die 16 of FIG. 11 at a subsequent stage in processing. A metal deposition layer (which may be referred to as a bond pad metal layer) is formed over first passivation layer 320 which includes a metal portion formed within opening 322 which corresponds to a portion of plating bus 224 and electrically contacts metal portion 314, a metal portion 330 formed within opening 324 and electrically contacting metal portion 316 (and thus edge seal 226), and a metal portion within opening 326 which corresponds to bond pad 236 and electrically contacts metal portion 318. Note that metal portion 330 may be referred to as an edge seal portion. The metal deposition layer may be formed of aluminum, and, in this case, may be referred to as an aluminum deposition layer. Note that metal portion 318 of last metal interconnect layer 308 (which may extend laterally beyond the metal portion of the metal deposition layer which corresponds to bond pad 236, as illustrated in FIG. 12) may also be considered part of bond pad 236. Note that metal portion 310, which is formed in one of interconnect layers 306, extends laterally past edge seal 226 on a first side toward die 16 and extends laterally past edge seal 226 on a second side toward plating bus 224.

Figure 13:
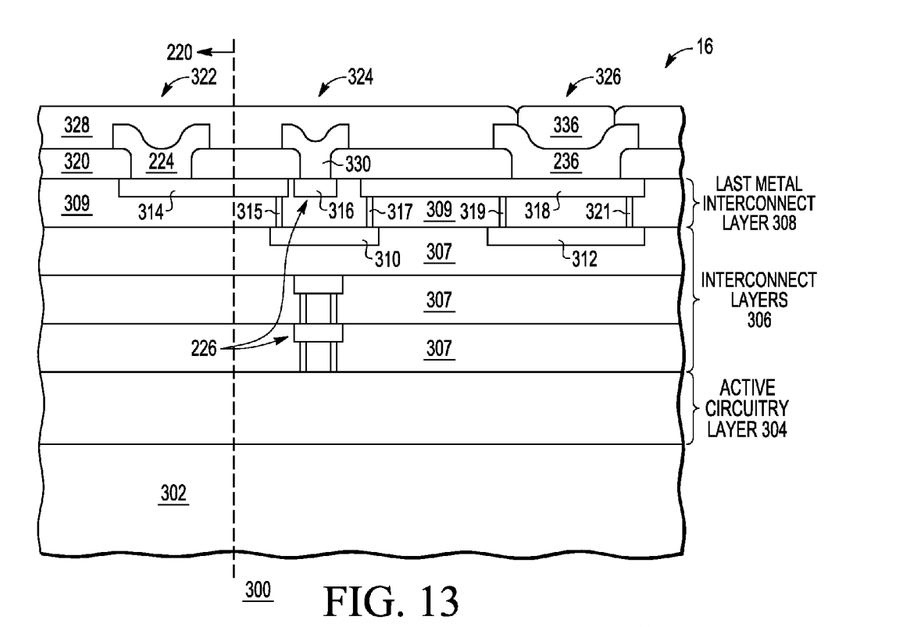
FIG. 13 illustrates a cross sectional view of the portion of FIG. 12 at a subsequent stage in processing, in accordance with an embodiment of the present invention.

FIG. 13 illustrates a cross sectional view of the portion of die 16 of FIG. 12 at a subsequent stage in processing. A final passivation layer 328 is formed over first passivation layer 320, and over the bond pad metal layer. Therefore, final passivation layer 328 is formed over metal portions 224 and 330 and bond pad 236. An opening is formed in final passivation layer 328 to expose bond pad 236 and an over pad metallurgy (OPM) 336 is then formed over the exposed portion of bond pad 236. In one embodiment, during plating, a voltage is applied to plating bus 224 such that a current is applied to bond pad 236 by way of metal portion 318, at least one via 317, metal portion 310, at least one via 315, metal portion 314, and plating bus 224 (in which metal portion 318 extending from bond pad 236, vias 317 and 315, metal portion 310, and metal portion 314 extending to plating bus 224 correspond to trace 230). In this manner, OPM 336 can be electrolytically plated on bond pad 236. In one embodiment, OPM 336 is plated onto bond pad 236 by immersing wafer 10 into a plating solution and applying a voltage to plating bus 224. OPM 336 may be referred to as a plated layer and may include any number of plated layers. In one embodiment, OPM 336 includes a plated nickel layer. Therefore, as can be seen in FIG. 13, trace 230 and plating bus 224 are both located under final passivation layer 328. Trace 230 includes a portion (corresponding to metal portion 310) which extends through edge seal 226 and thus is still located below final passivation layer 328. Note that saw street 220 is indicated in FIG. 13 as being to the left of the dotted line, in which edge seal 226 is located within die 16 and plating bus 224 is located within saw street 220.

Figure 14:
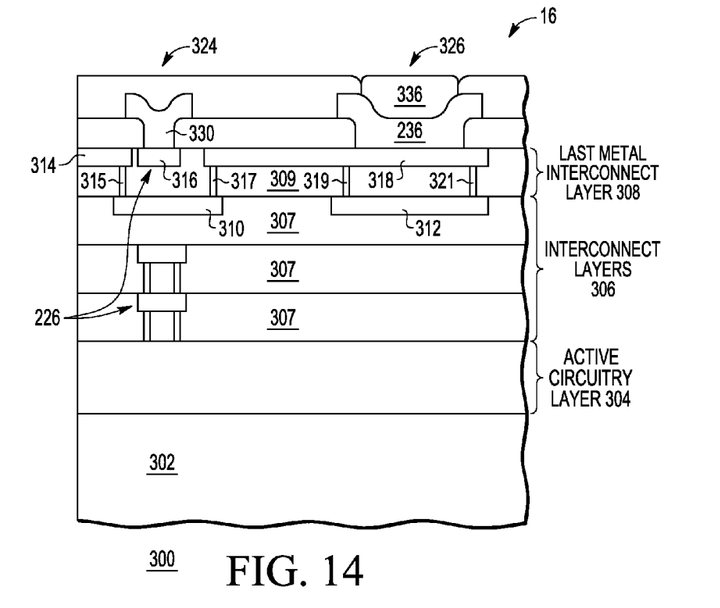
FIG. 14 illustrates a cross sectional view of the portion of FIG. 13 at a subsequent stage in processing, in accordance with an embodiment of the present invention.

FIG. 14 illustrates a cross sectional view of the portion of die 16 of FIG. 13 at a subsequent stage in processing. Wafer 10 is singulated which separates die 16 from wafer 10. The singulation occurs in saw street 220 and severs the plating bus connection. That is, plating bus 224 and part of trace 230 is severed from die 16. In this manner, referring back to FIG. 8, each of bond pads 234, 236, and 238 are no longer electrically connected to plating bus 224, and plating bus 224 is no longer connected to plating bus 242 since bus connector 240 is also severed.

Figure 15:
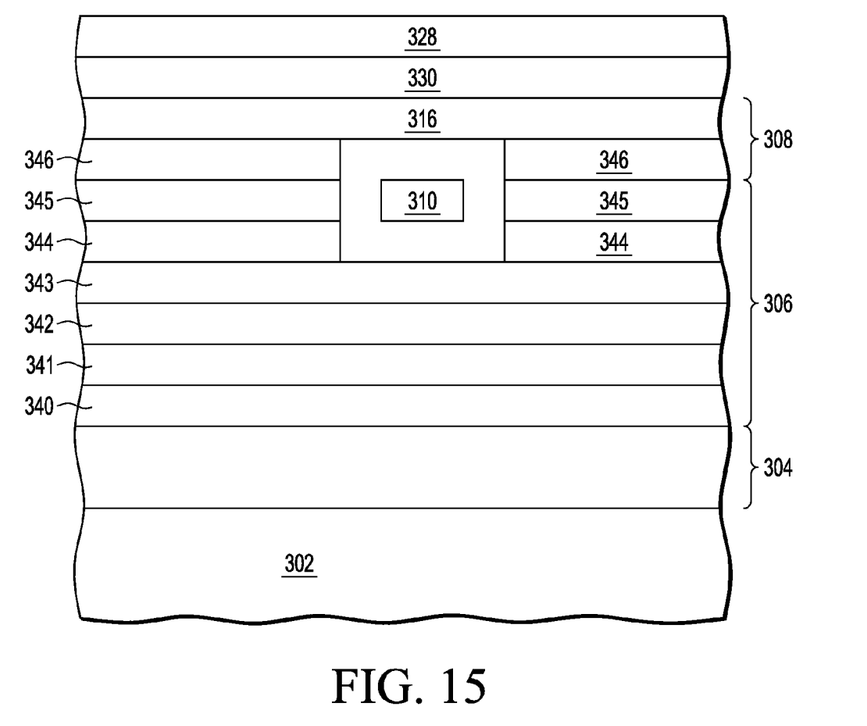
FIG. 15 illustrates a cross section view of the portion of FIG. 14 as seen from a different cross section location, in accordance with an embodiment of the present invention.

FIG. 15 illustrates a cross section of edge seal 226 of FIG. 14 taken in a direction perpendicular to the direction of the cross section of FIG. 14. That is, the cross section of FIG. 15 illustrates edge seal 226 as if one were in die 16 looking out toward the edge of die 16 on the opposite side of edge seal 226 (towards where saw street 220 was located). As can be seen in FIG. 15, interconnect layers 306 includes a number of via layers 340, 342, and 344 of edge seal 226, and a number of metal layers 341, 343, and 345 of edge seal 226. Last metal layer 308 includes a via layer 346 of edge seal 226 and a metal layer 316 of edge seal 226. Therefore, each of the illustrated layers 340-346 and 316 represent the metal of edge seal 226, which, as discussed above, may include copper. An opening is formed in layers 344-346 in which metal portion 310 extends through, as was described in reference to FIGS. 9-14. Therefore, while edge seal 226 is vertically continuous, it is not solidly continuous in that it includes openings through which traces can extend in order to make contact between bond pads and the plating bus.

Therefore, in the embodiment illustrated in FIGS. 8-15 (as with the embodiment in FIGS. 2-7) a plating bus need not be added over final passivation 328 in order to electrolytically plate the OPM on bond pad metal 236. Furthermore, since a plating bus need not be added over final passivation 328, it also does not need to be subsequently removed.

By now it should be appreciated that there has been provided a plating bus which may be used for electrolytic plating of bond pads which is located below the final passivation layer and utilizes a portion of the last metal interconnect layer. Subsequent singulation severs the plating bus connections. In this manner, a plating bus need not be added over final passivation and subsequently removed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, each trace may extend through the edge seal in any of the interconnect layers or may be formed over the edge seal and still remain under the final passivation layer. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

Item 1 includes a semiconductor wafer, including a die adjacent to a saw street; an edge seal along a perimeter of the die, wherein the edge seal includes a first conductive layer formed in a last interconnect layer of the die; a bond pad formed as part of one of a group consisting of the last interconnect layer and a metal deposition layer above the last interconnect layer; a plating bus within the saw street; a trace connected to the bond pad and to the plating bus by a manner comprising one of a group consisting of (1) over the edge seal, insulated from the edge seal, and formed in the metal deposition layer and (2) through the edge seal and insulated from the edge seal. Item 2 includes the semiconductor wafer of item 1, wherein the bond pad further comprises a plated layer over the metal deposition layer of the bond pad. Item 3 includes the semiconductor wafer of item 2, wherein the plated layer includes nickel. Item 4 includes the semiconductor wafer of item 2, wherein the trace is connected to the bond pad and to the plating bus by the manner including over the edge seal, insulated from the edge seal, and formed as part of the metal deposition layer. Item 5 includes the semiconductor wafer of item 4, wherein the last interconnect layer includes copper. Item 6 includes the semiconductor wafer of item 5, wherein the bond pad is part of both the last interconnect layer and the metal deposition layer and includes a first portion of the last metal interconnect layer. Item 7 includes the semiconductor wafer of item 6, wherein the bond pad has a portion of the last metal interconnect layer and a portion of the metal deposition layer in which the portion of the last metal interconnect layer extends laterally beyond the portion of the metal deposition layer. Item 8 includes the semiconductor wafer of item 7, wherein the trace is coupled to the portion of the last metal interconnect layer. Item 9 includes the semiconductor wafer of item 2, wherein the trace is connected to the bond pad and to the plating bus by the manner including through the edge seal and insulated from the edge seal. Item 10 includes the semiconductor wafer of item 9, wherein the edge seal includes a portion from each of a plurality of metal interconnect layers including the last interconnect layer. Item 11 includes the semiconductor wafer of item 10, wherein the trace comprises a portion of an additional metal interconnect layer, wherein the portion of the additional metal interconnect layer extends laterally past the edge seal on a first side toward the die and extends laterally past the edge seal on a second side toward the plating bus. Item 12 includes the semiconductor wafer of item 11, wherein the trace further includes a first via connected to a first portion of the last interconnect layer and a second via connected to a second portion of the last interconnect layer, wherein the first portion of the last interconnect layer is connected to the bond pad and the second portion of the last interconnect layer is connected to the plating bus.

Item 13 includes a method of forming a semiconductor die, including forming the semiconductor die on a semiconductor wafer using a plurality of interconnect layers; using the plurality of interconnect layers to form an edge seal around the die; using one of a group consisting of a metal deposition layer and a last interconnect layer of the plurality of interconnect layers to form a bond pad on the die; forming a plating bus within a saw street, wherein the edge seal is adjacent to the saw street; and forming a trace using one of a group consisting of the metal deposition layer and one of the plurality of interconnect layers to couple the bond pad to the plating bus. Item 14 includes the method of item 13, and further includes plating the bond pad. Item 15 includes the method of item 14, wherein the plating occurs in response to applying a voltage to the plating bus. Item 16 includes the method of item 15, and further includes physically separating the edge seal from the plating bus along a side of the saw street after the plating thereby breaking the trace and thereby decoupling the bond pad from the plating bus. Item 17 includes the method of item 16, wherein the forming the trace includes using the metal deposition layer so that the trace passes over the edge seal and is insulated from the edge seal. Item 18 includes the method of item 16, wherein the forming the trace includes using one the plurality of interconnect layers so that the trace passes through the edge seal and is insulated from the edge seal.

Item 19 includes a method of plating a bond pad of a semiconductor die on a wafer having a plurality of semiconductor die, including forming the die using a plurality of interconnect layers; forming a plating bus within a saw street, wherein the die is adjacent the saw street; forming a bond pad on the die; forming a trace to electrically couple the bond pad to the plating bus; plating the bond pad by immersing the wafer in a plating solution and applying a voltage to the plating bus. Item 20 includes the method of item 19, and further includes forming an edge seal between the bond pad and the saw street along a perimeter of the die using the plurality of interconnect layers; and breaking the trace to electrically decouple the bond pad from the plating bus.

What is claimed is:

1. A method of forming a semiconductor die, comprising:
   forming the semiconductor die on a semiconductor wafer using a plurality of interconnect layers;
   using the plurality of interconnect layers to form an edge seal around the die;
   using one of a group consisting of a metal deposition layer and a last interconnect layer of the plurality of interconnect layers to form a bond pad on the die;
   forming a plating bus within a saw street, wherein the edge seal is adjacent to the saw street; and
   forming a trace using one of a group consisting of the metal deposition layer and one of the plurality of interconnect layers to couple the bond pad to the plating bus.

2. The method of claim 1, further comprising:
   electrolytically plating the bond pad.

3. The method of claim 2, wherein the plating occurs in response to applying a voltage to the plating bus.

4. The method of claim 3, further comprising physically separating the edge seal from the plating bus along a side of the saw street after the plating thereby breaking the trace and thereby decoupling the bond pad from the plating bus.

5. The method of claim 4, wherein the forming the trace comprises using the metal deposition layer so that the trace passes over the edge seal and is insulated from the edge seal.

6. The method of claim 4, wherein the forming the trace comprises using one the plurality of interconnect layers so that the trace passes through the edge seal and is insulated from the edge seal.

7. A method of plating a bond pad of a semiconductor die on a wafer having a plurality of semiconductor die, comprising:
- forming the die using a plurality of interconnect layers;
- forming a plating bus within a saw street, wherein the die is adjacent the saw street;
- forming a bond pad on the die;
- forming a trace to electrically couple the bond pad to the plating bus;
- plating the bond pad by immersing the wafer in a plating solution and applying a voltage to the plating bus.

8. The method of claim 7, further comprising:
- forming an edge seal between the bond pad and the saw street along a perimeter of the die using the plurality of interconnect layers; and
- breaking the trace to electrically decouple the bond pad from the plating bus.

\* \* \* \* \*